(12) United States Patent
Furrer et al.

(10) Patent No.: US 10,053,190 B2
(45) Date of Patent: Aug. 21, 2018

(54) ARTICLE WITH CONTROLLABLE WETTABILITY

(71) Applicants: United Technologies Corporation, Farmington, CT (US); The University of Connecticut, Farmington, CT (US)

(72) Inventors: David Ulrich Furrer, Marlborough, CT (US); Sergei F. Burlatsky, West Hartford, CT (US); Paul Elliott, Gales Ferry, CT (US); Stephen P. Stagon, Jacksonville, FL (US); Hanchen Huang, Newton, MA (US)

(73) Assignees: United Technologies Corporation, Farmington, CT (US); The University of Connecticut, Farmington, CT (US)

( * ) Notice: Subject to any disclaimer, the term of this patent is extended or adjusted under 35 U.S.C. 154(b) by 6 days.

(21) Appl. No.: 15/501,940

(22) PCT Filed: Aug. 7, 2015

(86) PCT No.: PCT/US2015/044115
§ 371 (c)(1),
(2) Date: Feb. 6, 2017

(87) PCT Pub. No.: WO2016/022869
PCT Pub. Date: Feb. 11, 2016

(65) Prior Publication Data
US 2017/0225746 A1    Aug. 10, 2017

Related U.S. Application Data

(60) Provisional application No. 62/034,457, filed on Aug. 7, 2014.

(51) Int. Cl.
*B32B 5/16*    (2006.01)
*B32B 7/12*    (2006.01)
(Continued)

(52) U.S. Cl.
CPC ............... *B63B 1/34* (2013.01); *B05D 3/061* (2013.01); *B05D 3/14* (2013.01); *B81B 1/00* (2013.01);
(Continued)

(58) Field of Classification Search
CPC ......... B63B 1/34; B81C 1/00206; B81B 1/00; B81B 2201/058; B05D 3/14; B05D 3/061; F15D 1/0065
(Continued)

(56) References Cited

U.S. PATENT DOCUMENTS 6,146,798 A    11/2000  Bringans et al.
7,972,691 B2   7/2011   Chiruvolu et al.
(Continued)

FOREIGN PATENT DOCUMENTS

EP    2426179       3/2012
WO    2005053836    6/2005
WO    2007101174    9/2007

OTHER PUBLICATIONS

International Preliminary Report on Patentability for International Application No. PCT/US2015/044115 dated Feb. 2, 2017.
(Continued)

*Primary Examiner* — William K Cheung
(74) *Attorney, Agent, or Firm* — Carlson, Gaskey & Olds, P.C.

(57) ABSTRACT

An article with controllable wettability includes a substrate and a layer of a composite material supported on the substrate. The layer has an exposed surface and the composite material includes particles that have controllable polarization embedded fully or partially in a matrix. A controller is operable to selectively apply a controlled variable activation energy to the layer. The controllable polarization of the particles varies responsive to the controlled variable activation energy such that a wettability of the exposed surface also varies responsive to the controlled variable activation energy.

18 Claims, 2 Drawing Sheets

(51) Int. Cl.
  *B63B 1/34* (2006.01)
  *B81C 1/00* (2006.01)
  *B81B 1/00* (2006.01)
  *B05D 3/14* (2006.01)
  *B05D 3/06* (2006.01)
  *F15D 1/00* (2006.01)

(52) U.S. Cl.
  CPC ........ *B81C 1/00206* (2013.01); *F15D 1/0065* (2013.01); *B81B 2201/058* (2013.01)

(58) Field of Classification Search
  USPC .................................................. 428/328, 343
  See application file for complete search history.

(56) References Cited

U.S. PATENT DOCUMENTS

| | | |
|---|---|---|
| 8,257,562 B2 | 9/2012 | Isaksson et al. |
| 8,648,136 B2 | 2/2014 | Kambe et al. |
| 2007/0170059 A1 | 7/2007 | Lee et al. |
| 2008/0098917 A1 | 5/2008 | Rikihisa et al. |
| 2008/0100905 A1 | 5/2008 | Kato et al. |
| 2008/0296252 A1 | 12/2008 | D'Urso et al. |
| 2009/0011222 A1 | 1/2009 | Xiu et al. |
| 2010/0027118 A1 | 2/2010 | Rosenman et al. |
| 2010/0110532 A1 | 5/2010 | Takemoto et al. |
| 2011/0266151 A1 | 11/2011 | Jansson |
| 2012/0015146 A1 | 1/2012 | Advincula et al. |
| 2012/0276334 A1* | 11/2012 | Fedynyshyn ............ B05D 5/04 428/141 |
| 2013/0192993 A1 | 8/2013 | Mardilovich et al. |
| 2014/0166863 A1* | 6/2014 | Yamada ................. G01N 21/65 250/216 |

OTHER PUBLICATIONS

Krupenkin, T., Taylor, J., Schneider, T. & Yang, S. (2004). From rolling ball to complete wetting: the dynamic tuning of liquids on nanostructured surfaces. Langmuir: the ACS journal of surfaces and colloids 20. pp. 3824-3827.

Feng, X. et al. (2004). Reversible super-hydrophobicity to super-hydrophilicity transition of aligned ZnO nanorod films. Journal of the American Chemical Society 126. oo. 62-3.

Verplanck, N, Galopin, E., Camart, J. & Thomy, V. (2007). Reversible electrowetting on superhydrophobic silicon nanowires. Nano letters 7.3. pp. 813-817.

Dhindsa, M.S. (2006) Reversible electrowetting of vertically aligned superhydrophobic carbon nanofibers. Langmuir 22.21. pp. 9030-9034.

Yokomaku, H., Satoh, W., Fukuda, J., & Suzuki, H. (2008). Electrowetting on gold electrodes with microscopic three-dimensional structures for microfluidic devices. J. Appl. Phys. 104, 064910.

Lin, P., Feng, Y. & Chan, H. (2009). Improvement of the tunable wettability property of poly(3-alkylithiophene) films. Lanmuir: American Chemical Society. 25(13). pp. 7465-7470.

Satoh, W., Yokomaku, H., Hosono, H., Ohnishi, N., & Suzuki, H. (2008). Electrowetting-based valve for the control of the capillary flow. J.Appl. Phys. 103, 034903.

International Search Report for International Application No. PCT/US2015/044115 completed Jan. 18, 2016.

Papadopoulou, E.L., Pagkozidis, A., Barberoglou, M., Fotakis, and Stratakis, E (2010). Electrowetting properties of ZnO and TiO2 nanostructured thin films. Journal of Physical Chemistry. vol. 114. 2010. pp. 10249-10253.

Lee, M. W., AN, S., Joshi, B., Latthe, S. S., and Yoon, S. S. (2013). Highly efficient wettability control via three-dimensional (3D) suspension of titania nanoparticles in polystyrene nanofibers. ACS Applied Materials & Interfaces. vol. 5. 2013. pp. 1232-1239.

Supplementary European Search Report for European Patent Application No. 15830434.5 dated Mar. 23, 2018.

* cited by examiner

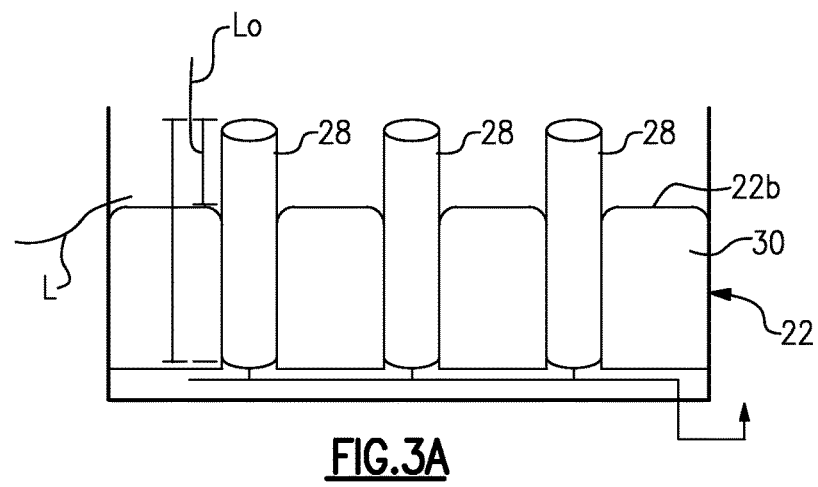
FIG.3A
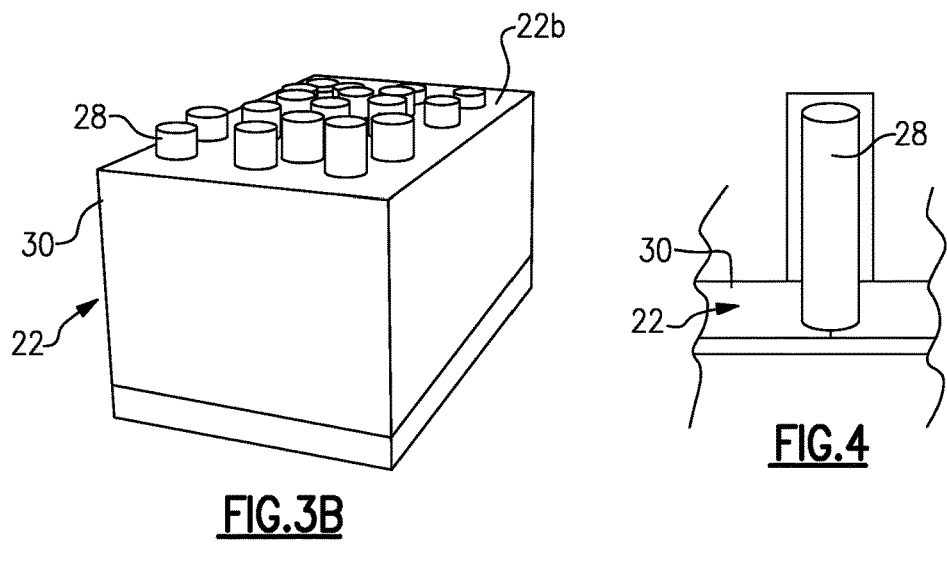
FIG.3B
FIG.4
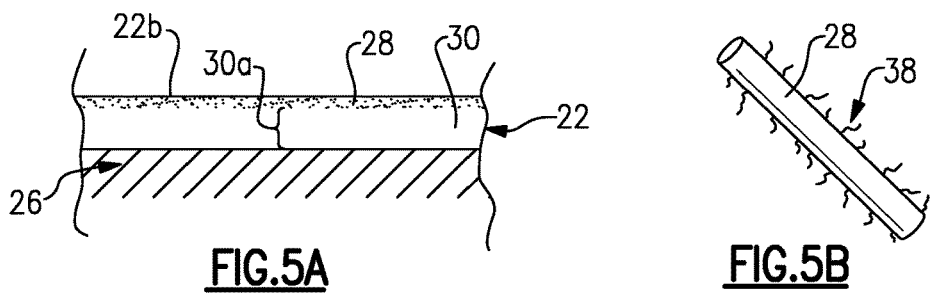
FIG.5A
FIG.5B

ARTICLE WITH CONTROLLABLE WETTABILITY

CROSS-REFERENCE TO RELATED APPLICATION

This application is a 371 National Stage of International Application No. PCT/US2015/044115, filed Aug. 7, 2015, which claims the benefit of U.S. Provisional Patent Application No. 62/034,457, filed Aug. 7, 2014, the disclosures of which are fully incorporated herein by reference as if fully set forth herein.

BACKGROUND

This disclosure relates to a coating that has controllable wettability. Hydrophobic and ultra-hydrophobic surface coatings are known and used to repel water. Such coatings are typically fabricated from a polymeric material which, while water-repellant, has relatively low strength and low temperature resistance. Additionally, the wettability of some structures is dynamically adjustable from super-hydrophobic to hydrophilic. Although useful, these often rely upon fragile structural details.

SUMMARY

An article with controllable wettability according to an example of the present disclosure includes a substrate with a layer of a composite material supported on the substrate. The layer has an exposed surface, and the composite material includes nanoparticles having controllable polarization embedded fully or partially in a matrix. A controller is operable to selectively apply a controlled variable activation energy to the layer. The controllable polarization of the nanoparticles varying responsive to the controlled variable activation energy such that a wettability of the exposed surface also varies responsive to the controlled variable activation energy.

In a further embodiment of any of the foregoing embodiments, the nanoparticles are partially embedded such that portions of the nanoparticles are exposed at the exposed surface.

In a further embodiment of any of the foregoing embodiments, the particles are elongated and, with respect to the length of the particle, less than 50% of the length is exposed at the exposed surface.

In a further embodiment of any of the foregoing embodiments, the nanoparticles are fully embedded.

In a further embodiment of any of the foregoing embodiments, the controlled variable activation energy is an applied voltage.

In a further embodiment of any of the foregoing embodiments, the controlled variable activation energy is ultraviolet electromagnetic radiation.

In a further embodiment of any of the foregoing embodiments, the matrix is selected from a group consisting of polymers, metals, non-metals, and metal oxides, and the nanoparticles are selected from conductive polymers, metals, non-metals, and metal oxides.

In a further embodiment of any of the foregoing embodiments, the matrix and particles are independently selected from a group consisting of metals and metal oxides.

In a further embodiment of any of the foregoing embodiments, the nanoparticles are metal oxide.

In a further embodiment of any of the foregoing embodiments, the metal oxide is zinc oxide (ZnO), titanium dioxide (TiO2), iron oxide (FeO), indium oxide (InO), tin oxide (SnO), chromium oxide (CrO).

In a further embodiment of any of the foregoing embodiments, the nanoparticles are concentrated near the exposed surface with respect to through-thickness of the layer.

In a further embodiment of any of the foregoing embodiments, the nanoparticles have a functionalized surface.

In a further embodiment of any of the foregoing embodiments, the functionalized surface includes at least one of polyethylene glycol (PEG), polyethylene oxide (PEO), polyamidoamine (PAMAM), and aminothiophenol.

In a further embodiment of any of the foregoing embodiments, the nanoparticles are uniformly dispersed through the layer.

A method for controlling an article with controllable wettability according to an example of the present disclosure includes selectively applying a controlled variable activation energy to a layer of a composite material supported on a substrate. The layer has an exposed surface, and the composite material includes nanoparticles having controllable polarization embedded fully or partially in a matrix. The controlled variable activation energy changes the controllable polarization of the nanoparticles such that a wettability of the exposed surface varies responsive to the controlled variable activation energy.

A further embodiment of any of the foregoing embodiments includes selectively applying a controlled variable activation energy to increase/decrease drag on the exposed surface by changing the wettability.

A further embodiment of any of the foregoing embodiments includes selectively applying a voltage as the controlled variable activation energy, to resistively heat the nanoparticles, melt ice on the layer, and reduce the wettability to shed the melted ice.

A further embodiment of any of the foregoing embodiments includes selectively applying a controlled variable activation energy to increase/decrease flow of a surface-interacting fluid across the exposed surface by changing the wettability.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 3A shows a cross-section wherein nanoparticles protrude from an exposed surface.

FIG. 3B illustrates a perspective view of the article of 3A.

FIG. 4 shows another example in which nanoparticles at an exposed surface are covered by a thin layer of matrix material.

FIG. 5A illustrates an example with nanoparticles that are concentrated in a layer near the exposed surface.

FIG. 5B shows a representative example of a nanoparticle having a functionalized surface.

DETAILED DESCRIPTION

Figure 1:
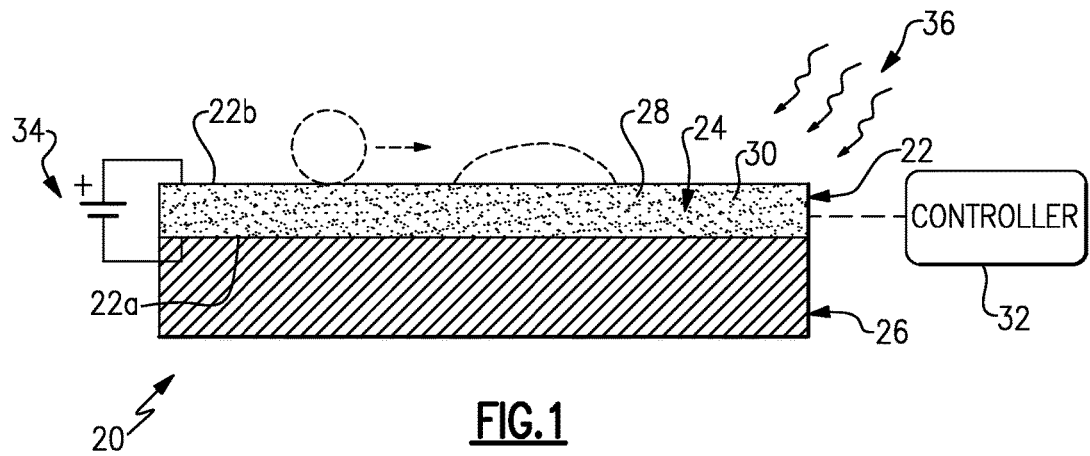
FIG. 1 illustrates an example article with controllable wettability.

FIG. 1 illustrates an example article 20 that has controllable wettability. As can be appreciated, a representative portion of the article 20 is shown here for the purpose of describing aspects of this disclosure. It is to be understood that the article 20 can have practically any form that would benefit from this disclosure. For example, the article 20 can be an aircraft engine or portion thereof, aircraft air frame or portion thereof, hydro-surface or portion thereof, such as a boat hull, a window surface or portion thereof, such as but not limited to a vehicle windshield, eye glass or the like, solar panel or portion thereof, or microfluidic device or portion thereof, a medical device, like one for drug delivery, or portion thereof, or a sensor or portion thereof. As will be described in further detail, the article 20 includes a layer 22 that has good strength, durability, and temperature resistance relative to conventional engineering materials.

The layer 22 is formed of a composite material 24 and is supported on a substrate 26. The layer 22 includes an interface 22a that is bonded to the substrate 26 and an exposed surface 22b that is open to the surrounding environment of the article 20. The interface surface 22a can be directly bonded to the substrate 26 or, alternatively, bonded with one or more interlayers.

The composite material 24 includes nanoparticles 28 that are fully or partially embedded in a matrix 30. The nanoparticles 28 have controllable polarization that changes in response to application of a controlled variable activation energy, such as an applied voltage or applied ultraviolet electromagnetic radiation. In this regard, the article 20 also includes a controller 32 that is operatively connected with the layer 22 and controls application of a voltage, represented at 34, or ultraviolet electromagnetic radiation, represented at 36. As can be appreciated, the voltage 34, ultraviolet electromagnetic radiation 36, or both, can be used to adjust the controllable polarization of the nanoparticles 28 to in turn control the wettability at the exposed surface 22b of the layer 22. For example, a voltage potential difference can also cause modification to a liquid that has dissolved ions (e.g., salt water). Thus, the applied voltage potential, in addition to modifying polarization of the nanoparticles 28, can also modify or increased attraction of a liquid.

The composite material 24 can be tailored to provide a high degree of strength, durability, and temperature resistance through selection of the nanoparticles 28 and the matrix 30. For example, the matrix 30 is selected from polymers, metals, non-metals, and metal oxides, and the nanoparticles 28 are selected from metals, non-metals, and metal oxides. For relatively greater strength and durability, the matrix 30 is a metal or metal oxide. In further examples, the nanoparticles 28 are metal oxide. The metal oxide can be zinc oxide (ZnO), titanium dioxide (TiO2), iron oxide (FeO), indium oxide (InO), tin oxide (SnO), chromium oxide (CrO), or combinations thereof, which provides controllable polarization.

The controller 32 can include hardware, software, or a combination thereof that is programmed in accordance with any functions or steps described herein to control the wettability of the layer 22. For example, the controller 32 can selectively change the layer 22 between at least three states. A first state is a default state in which no variable activation energy is applied to the layer 22. In this default state, the inherent characteristics of the layer 22 determine the wettability at the exposed surface 22b. In a second state, the controller 32 selectively applies a first controlled variable activation energy to the layer 22 to increase wettability at the exposed surface 22b. In a third state, the controller 32 applies a second controlled variable activation energy to reduce wettability of the layer 22 at the exposed surface 22b.

In some examples, the activation energy is rapidly switched between positive and negative or ON/OFF.

Figure 2A:
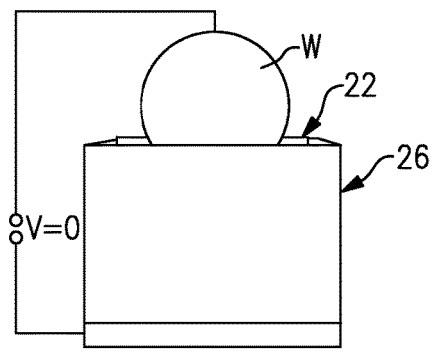
FIG. 2A shows an article in a default state of wettability.
Figure 2B:
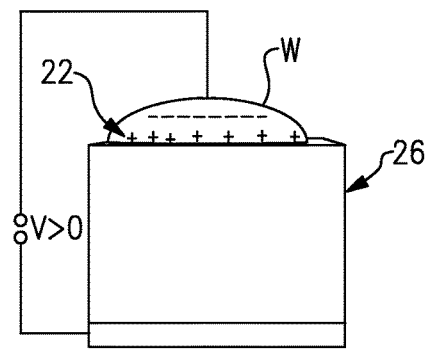
FIG. 2B shows the article under an applied controlled variable activation energy to increase wettability.
Figure 2C:
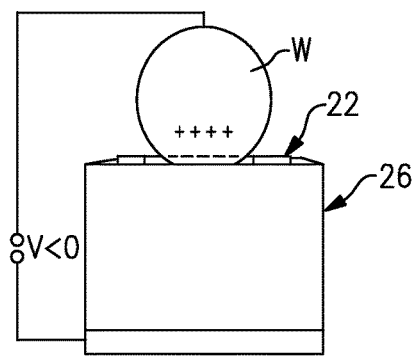
FIG. 2C shows the article under another applied controllable variable activation energy to decrease wettability.

FIGS. 2A, 2B, and 2C illustrate three example states. As shown in FIG. 2A, in a default state where no variable activation energy is applied, here a zero voltage, the inherent characteristics of the layer 22 determine wettability of the water droplet, W, on the layer 22. In FIG. 2B, the controller 32 applies a positive or negative voltage greater than zero across the layer 22 to increase wettability on the layer 22. In FIG. 2C, the controller 32 applies a positive or negative voltage less than zero across the layer 22 to reduce the wettability of the layer 22, in the case of different surface and droplet chemistry. For example, the controller 32 can control the application of the controlled variable activation energy to change the wettability between hydrophilic, hydrophobic, and/or ultra-hydrophobic. As can be appreciated, the wettability can be represented by a contact angle between the water droplet and the exposed surface 22b of the layer 22. The hydrophobicity, ultra-hydrophobicity, and hydrophilicity can be defined at determined contact angles. The hydrophilicity, hydrophobicity, and ultra-hydrophobicity can be defined at determined contact angles of less than 90 degrees, greater than 90 degrees, and greater than 135 degrees, respectively.

The nanoparticles 28 can be nanorods, nanowires, or other nanoparticles that have a minimum dimension that is less than 1500 nanometers. In further examples, the minimum dimension is less than 50 nanometers, or even less than 25 nanometers.

The nanoparticles 28 can be fully or partially embedded in the matrix 30. FIGS. 3A and 3B show an example of the nanoparticles 28 partially embedded. In this example, the nanoparticles 28 are elongated nanorods that protrude from the exposed surface 22b. However, the portions of the nanoparticles 28 that protrude are small relative to the overall size of the nanoparticles 28 such that the exposed, protruding portions do not easily break off and compromise the durability or functionality of the article 20. For example, the nanoparticles 28 have an overall average length, L, and a protrusion average length of $L_0$. In one example, $L_0$ is 25% or less of the overall length, L. The amount exposed can also vary in dependence on the material of the matrix 30. For a polymer matrix, the polymer contains the nanorods while allowing for lateral displacement under load. In some examples, approximately 50% of the overall length L can be exposed, and the matrix 30 retains the nanorods by binding with the remaining 50% of the length. In other example, the matrix 30 may be necessary for abrasion resistance, and only 1% of the overall length is exposed. Thus, in some examples a relatively large portion of the overall length of the nanorods can be exposed and the matrix adding to the "adhesion" to the substrate, and in other examples only a relatively small portion of the nanorods are exposed only to change the wettability. In some cases, the ends of the nanorods can be flush with the surface of the matrix 30.

FIG. 4 shows a modified example in which the representative nanoparticle 28 is encapsulated in the matrix material 30 instead of being exposed at the surface 22b. In this example, the nanoparticles 28 protrude, but the portions that were exposed in the example of FIGS. 3A/3B are covered by a relatively thin layer of the material of the matrix 30. The thin layer of the matrix 30 over the nanoparticles 28 protects the nanoparticles 28 from the surrounding environment but is thin enough such that the nanoparticles 28 can interact with a fluid exposed at the surface 22b. The amount or thickness of the relatively thin layer can be as little as is effective to modify adhesion of the nanorods or to modify the surface properties of the nanorods. In some examples, the thickness is three or fewer molecular layers of the matrix material.

As shown in FIG. 1, the nanoparticles 28 are relatively uniformly distributed through the matrix 30. However, in an alternate, modified example shown in FIG. 5A, the nanoparticles 28 are concentrated near the exposed surface 22b such that an underlying portion of the layer 22, represented at 30a, is substantially matrix material that is free of the nanoparticles 28.

To concentrate the nanoparticles 28 near the exposed surface 22b of the layer 22, the nanoparticles 28 can be surface functionalized, as shown in FIG. 5B. In this example, a representative nanoparticle 28 includes surface ligands 38 that facilitate "floating" the nanoparticles 28 toward the exposed surface 22b during deposition of the layer 22. For example, surface functionalized nanoparticles 28 may be coated in general ligands, such as polyethylene glycol (PEG), polyethylene oxide (PEO), polyamidoamine (PAMAM), or thiol group linkers like aminothiophenol (4-ATP). The ligands can be either the terminating layer, possibly for the modification of surface interaction with a fluid, or used to attach and a second active layer which will not bond directly to the nanorod. The second added layer may be added using an intermediate ligand to attract specific chemical or biological species. The additional layer may be a second chemical, such as glucose or anti-EGFR. The chemical species that the additional chemical attracts can include organic molecules, such as oils, or inorganic molecules, such as sodium chloride, and the biological species may be cancer cells.

The nanoparticles 28 can be fabricated by solution synthesis, but alternatively may be grown or fabricated using other fabrication techniques and are not particularly limited. The nanoparticles 28 can be dispersed or mixed in a suitable precursor and deposited onto the substrate 26 and the precursor that can then be converted into the final matrix material to form the layer 22. For example, the precursor can be a polymeric precursor, a metallic precursor, or an oxide or ceramic precursor. Whereas polymeric materials may be relatively temperature-limited, the nanoparticles 28, especially metal oxide nanoparticles, have relatively high-temperature resistance and can therefore be processed at relatively high temperatures to form or deposit matrix material. Therefore, especially for matrix materials of metal and metal oxide, high-temperature processing can be used to form the layer 22. In this regard, the layer 22 can also be used in environments that are exposed to relatively high operating temperatures, such as but not limited to, turbine engine components.

The controlled wettability of the layer 22 permits utilization in many end-uses. Generally, the layer 22 can be used in any article where there is a need to control wettability of a surface. Such articles can include self-cleaning surfaces wherein the layer 22 functions as a self-cleaning coating on the article. For example, articles that may benefit from such a self-cleaning function can include solar panels, windshields, eye glasses, and the like.

In another example implementation, the layer 22 can be used on an aquatic surface. For instance, the layer 22 can be used to facilitate low friction movement of a vessel through water or to facilitate slowing of the vessel through the water. The layer 22 can be controlled to be in a hydrophobic or ultra-hydrophobic state to facilitate low friction movement of water across the exposed surface 22b. The wettability of the layer 22 can then be changed to be hydrophilic to facilitate the slowing of movement of water across the exposed surface 22b, such as to facilitate breaking of an aquatic vessel. For example, the layer 22 can be applied to the hull of a vessel to facilitate low friction movement or breaking of the vessel.

In another example implementation, the layer 22 can be used on the surface of an aircraft to facilitate de-icing. In this example, the coating will facilitate mitigation of condensation of water on the coated surface in the form of liquid or solid. Additionally, if condensation occurs and forms ice, voltage can be applied across the layer 22 to resistively heat the nanoparticles 28 of the layer 22 and melt any ice adhered to the exposed surface 22b. Once the ice melts, the water can be shed from the surface 22b through the hydrophobicity or ultra-hydrophobicity of the layer 22. Thus, the layer 22 can be actively controlled to de-ice and shed water from an aircraft surface, such as but not limited to an aircraft airfoil.

In yet another example implementation, the layer 22 can be used on one or more surfaces of a microfluidic device. Microfluidic devices can be used to move surface-interacting liquid (e.g., polar liquids such as water) through microchannels. The wettability on the exposed surface 22b of the microchannel can be controlled to facilitate or restrict liquid movement. One further example is a pump to apply force on and move the fluid, such as an artificial intestine.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An article with controllable wettability comprising:
   a substrate;
   a layer of a composite material supported on the substrate, the layer having an exposed surface, and the composite material including nanoparticles having controllable polarization embedded fully or partially in a matrix; and
   a controller operable to selectively apply a controlled variable activation energy to the layer, the controllable polarization of the nanoparticles varying responsive to the controlled variable activation energy such that a wettability of the exposed surface also varies responsive to the controlled variable activation energy.

2. The article as recited in claim 1, wherein the nanoparticles are partially embedded such that portions of the nanoparticles are exposed at the exposed surface.

3. The article as recited in claim 2, wherein the particles are elongated and, with respect to the length of the particle, less than 50% of the length is exposed at the exposed surface.

4. The article as recited in claim 1, wherein the nanoparticles are fully embedded.

5. The article as recited in claim 1, wherein the controlled variable activation energy is an applied voltage.

6. The article as recited in claim 1, wherein the controlled variable activation energy is ultraviolet electromagnetic radiation.

7. The article as recited in claim 1, wherein the matrix is selected from a group consisting of polymers, metals, non-metals, and metal oxides, and the nanoparticles are selected from conductive polymers, metals, non-metals, and metal oxides.

8. The article as recited in claim 1, wherein the matrix and particles are independently selected from a group consisting of metals and metal oxides.

9. The article as recited in claim 1, wherein the nanoparticles are metal oxide.

10. The article as recited in claim 9, wherein the metal oxide is zinc oxide (ZnO), titanium dioxide (TiO2), iron oxide (FeO), indium oxide (InO), tin oxide (SnO), chromium oxide (CrO).

11. The article as recited in claim 1, wherein the nanoparticles are concentrated near the exposed surface with respect to through-thickness of the layer.

12. The article as recited in claim 11, wherein the nanoparticles have a functionalized surface.

13. The article as recited in claim 11, wherein the functionalized surface includes at least one of polyethylene glycol (PEG), polyethylene oxide (PEO), polyamidoamine (PAMAM), and aminothiophenol.

14. The article as recited in claim 1, wherein the nanoparticles are uniformly dispersed through the layer.

15. A method for controlling an article with controllable wettability, the method comprising:

selectively applying a controlled variable activation energy to a layer of a composite material supported on a substrate, the layer having an exposed surface, and the composite material including nanoparticles having controllable polarization embedded fully or partially in a matrix, the controlled variable activation energy changing the controllable polarization of the nanoparticles such that a wettability of the exposed surface varies responsive to the controlled variable activation energy.

16. The method as recited in claim 15, including selectively applying a controlled variable activation energy to increase/decrease drag on the exposed surface by changing the wettability.

17. The method as recited in claim 15, including selectively applying a voltage as the controlled variable activation energy, to resistively heat the nanoparticles, melt ice on the layer, and reduce the wettability to shed the melted ice.

18. The method as recited in claim 15, including selectively applying a controlled variable activation energy to increase/decrease flow of a surface-interacting fluid across the exposed surface by changing the wettability.

* * * * *